United States Patent [19]

Hinz et al.

[11]  4,172,698
[45]  Oct. 30, 1979

[54] PRESSURE GAS OPERATED PUMP

[75] Inventors: Claus-Dieter Hinz, Lübeck; Edmund Krüger, Lübeck-Wesloe, both of Fed. Rep. of Germany

[73] Assignee: Drägerwerk Aktiengesellschaft, Fed. Rep. of Germany

[21] Appl. No.: 909,810

[22] Filed: May 26, 1978

[30] Foreign Application Priority Data

Jun. 14, 1977 [DE] Fed. Rep. of Germany ....... 2726667

[51] Int. Cl.$^2$ .................. F04B 17/00; F01L 31/02
[52] U.S. Cl. .................................. 417/393; 91/329; 91/346
[58] Field of Search .................. 417/393, 395, 397; 91/346, 347, 329

[56] References Cited

U.S. PATENT DOCUMENTS

| 1,913,308 | 6/1933 | Hueber et al. | 91/329 |
| 2,187,972 | 1/1940 | Hollander | 417/393 X |
| 2,626,527 | 1/1953 | Meyers | 91/347 X |
| 2,798,440 | 7/1957 | Hall | 417/393 |
| 2,864,342 | 12/1958 | Ziegelmeyer | 91/346 X |
| 3,167,083 | 1/1965 | Nickell | 91/346 X |
| 3,741,689 | 6/1973 | Rupp | 417/393 |
| 3,782,863 | 1/1974 | Rupp | 417/393 |
| 4,008,984 | 2/1977 | Scholle | 417/393 |

Primary Examiner—Carlton R. Croyle
Assistant Examiner—Leonard E. Smith
Attorney, Agent, or Firm—McGlew and Tuttle

[57] ABSTRACT

A pressure gas operated pump, comprises, a housing which has two spaced apart double pump chambers, with diaphragms stretched across each pump chamber so as to define a driving fluid chamber and a pump fluid chamber and a rigid coupling interconnects the diaphragms. There are valve inlet and outlet passages connected into the respective pump fluid chambers for handling the pump fluid during the movement of the diaphragm. A control valve is mounted in a control valve chamber, and it is connected to the fixed coupling by means of a bar spring which has its center portion fulcrummed on a contact with the wall of a bore through a transverse thin member of the housing. The driving gas is directed onto the valve chamber and it flows through the center of the valve member and, depending upon the position of the valve, which is regulated by the diaphragm, it will flow into respective ones of the two driving fluid chambers. The valve is held in an end position in which it is connected to supply pumping fluid to one chamber and to discharge fluid from the other chamber by biasing detent means. The biasing detent means are set with a biasing force which is produced on ball locks which engage into recesses of the valve member with a force which is less than the movement force of the bar spring of the coupling member and the friction overcome by the movement of the piston valve, so that it may be moved rapidly into its other end position during switching.

4 Claims, 2 Drawing Figures

PRESSURE GAS OPERATED PUMP

FIELD AND BACKGROUND OF THE INVENTION

This invention relates to pumps in general and, in particular, to a new and useful pressure gas operated double diaphragm pump.

Known diaphragm pumps include a chamber in a casing which is divided by a transverse diaphragm into two smaller chambers, namely, a pumping chamber and a driving chamber. The driving gas is fed to the driving chamber in pulses under pressure and is ejected again. These gas pulses cause the movement of the diaphragm inside the chamber, so that the pumping chamber is alternately increased and decreased in strokes. Due to these changes in size, the medium to be pumped is moved. Inlet and outlet valves are provided which regulate the direction of motion. The pulsating supply of the driving gas is controlled by means of a valve which receives its pulses from the filling level of the pumping chamber. In order to clearly separate the filling strokes from the discharge strokes, which is necessary for optimum filling, and thus the amount of delivery, known diaphragm pumps include holding means to ensure the movement of the diaphragm from one end position into the other only after the pumping chamber has been filled or emptied.

Another known double diaphragm pump has a pressure medium supply controlled by the position of the diaphragms. In this diaphragm pump, the two diaphragms are rigidly coupled with each other by a rod. This coupling rod has a cam which actuates the control arm of a rotary slide valve with which the pressure gas supply to the driving chambers is then controlled. Alternately, this rotary slide valve is actuated by a spring secured on the coupling rod, over which the rotary slide valve is to be switched obviously in jerks. The object is to achieve snap switching with which complete filling of the respective controlled pumping chamber is to be obtained. The control over the provided spiral springs requires a complicated mechanical design. It is doubtful if the friction of the rotary slide valve remains constant enough that the forces from the total pressure on the diaphragms are sufficient. Only in this way is a uniform switching rhythm ensured after the filling or discharging of the pumping chambers, see French Pat. No. 967,191.

A hydraulically operated double diaphragm pump is also known which consists of two casings arranged in an axis. Each casing is subdivided by a diaphragm into a pumping chamber and into a driving chamber. Both diaphragms are connected with each other by a coupling rod. The chambers which are traversed by the coupling rod serve as driving chambers, with the outer chambers serving as pumping chambers, provided with inlet and outlet valves. A piston valve controls the supply of the hydraulic driving fluid to one of the two driving chambers and the discharge from the other driving chamber. The end positions of the piston valve are fixed by a ball lock whose initial stress is adjustable. The shifting of the piston valve is effected by a rigid arm secured on the coupling rod, which slides over a pin-shaped extension of the piston valve and is connected with the valve in both directions of motion, each by a coil spring. When a driving chamber is filled with driving fluid, its diaphragm curves to the outside and entrains its arm over the coupling rod. The coil spring arranged in the direction of motion is tensioned, while the other is relaxed.

As soon as the spring forces exceed the force of the ball lock, the piston valve is moved into its other end position by the spring forces. The driving fluid can thus issue from the driving chamber, while its supply is switched to the other driving chamber. The transmission of the movement of the coupling rod through an arm and an operating rod to the control rod arranged in a separate casing is very bulky, and the mechanical expenditure for the control requires a very accurate adjustment and continuous control. Particularly critical are the two springs arranged on the operating rod for the control valve, since they must maintain their spring force, or otherwise, the click stop device will possibly no longer work properly, see German Pat. No. 1,453,607.

SUMMARY OF THE INVENTION

The present invention provides a compact, smoothly and safely working pressure gas operated conveyor device for cooling media which can be used, for example, in protective suits.

In accordance with the invention, the two diaphragms of the double-acting fluid pressure operated pump are interconnected by a rigid coupling. A control valve member for regulating the direction of a driving fluid into the respective driving fluid chambers on one side of each of the respective diaphragms is connected to the coupling between the diaphragms by a bar spring which is fulcrummed intermediate its length on an opening in the housing. The valve member is locked in end position by engagement of a biased detent into a groove of the cylindrical valve member and the holding force in the end position is only sufficient to provide for alignment of the inlet openings during the driving of the diaphragm of one of the pump portions while the other is being completely filled with the pump fluid and vice versa in respect to the other pumping chamber for the pump fluid.

The primary advantages achieved with the invention are the simple and safe construction of the pump. The transmission of the movement of the rigid coupling, and thus, of the position of the diaphragms, is effected by only one element to the piston valve. It is easy to maintain tolerances with the bar spring. With proper dimensioning, which presents no difficulties, it is possible to overcome the ball locks, and thus to achieve snap switching from the end position of the diaphragms. The short transmission path permits the arrangement of the control valve in the pump casing. The entire conveyor device for the cooling medium can be correspondingly small and compact. This is a great advantage for its use, for example, in a protective suit.

Accordingly, it is an object of the invention to provide a pressure gas operated pump, which includes a housing which is divided into two double pumping chambers, each of which is separated by respective first and second diaphragms, so as to define respective first and second driving fluid and pumping fluid chambers on respective sides of the diaphragm and which further includes a control valve which is axially displaceable in a chamber for regulating the control of the flow of a pressure fluid into the respective driving fluid chambers and which is movable axially between two end positions and which is coupled to a fixed coupling which extends between the two diaphragms by a spring bar which engages on a fulcrum portion of the housing and which also engages with the control valve so that it is shifted thereby to shift the coupling and the diaphragms during the pumping strokes and, wherein, detent means are included for biasing the control valve in respective end positions with a sufficient biasing force which may be overcome by the movement of the control valve during the admission of the driving gas for the next driving cycle.

A further object of the invention is to provide a pressure gas operated pump which is simple and safe in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
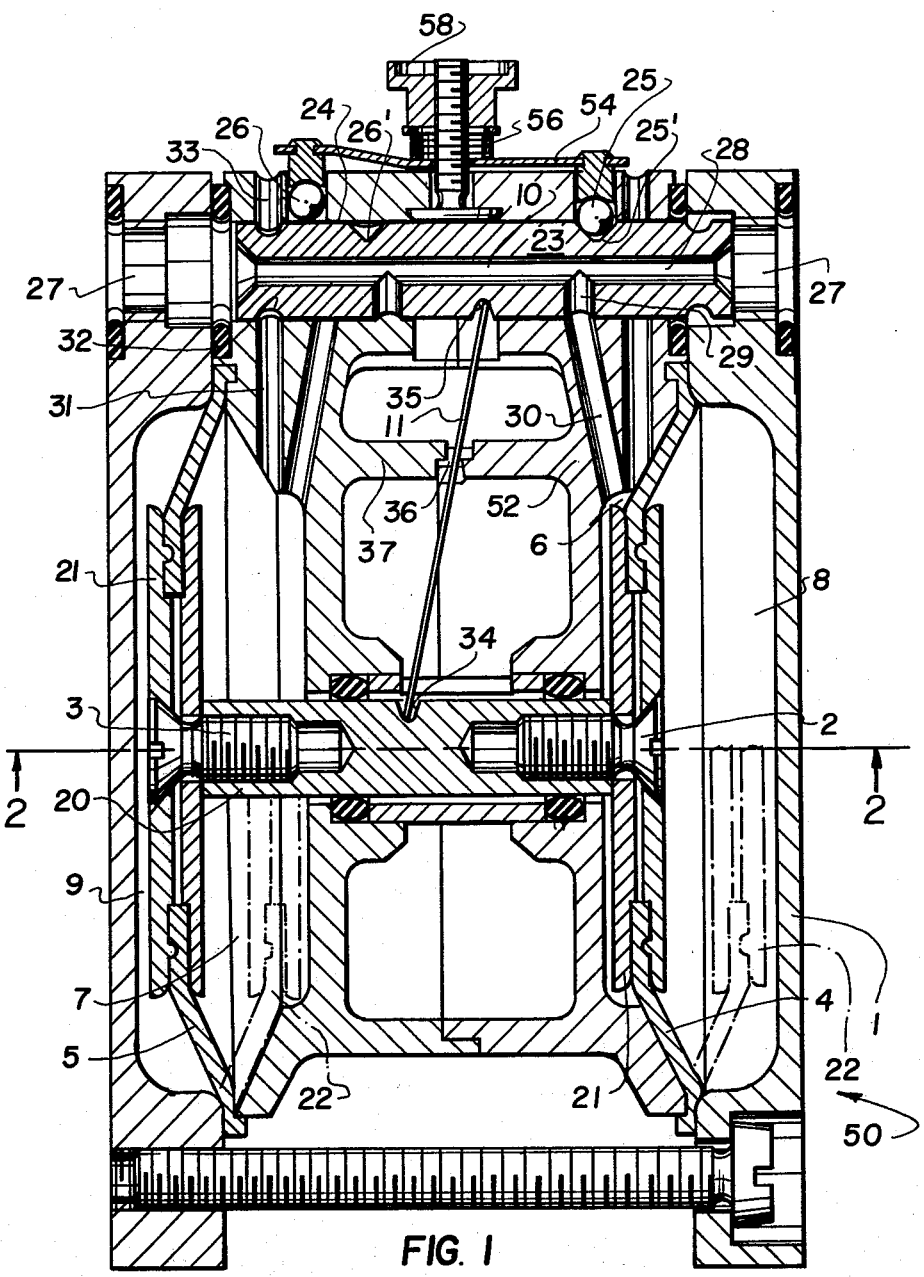
FIG. 1 is a vertical sectional view of a double diaphragm pump, constructed in accordance with the invention.

Referring to the drawings in particular, the invention embodied therein, comprises, a pressure gas operated double diaphragm pump, generally designated 50, in which the housing or casing 1 is divided into two double pumping chambers which are in turn subdivided by the diaphragms into respectively, a fluid chamber and pumping fluid chamber.

The double diaphragm pump 50 is operated with a pressure gas and it pumps a cooling medium through a heat exchange system (not shown) of a protective suit (also not shown). The pump contains two diaphragm pump portions 2 and 3 in a common casing, and a control valve 10 for the pump portions. The double diaphragm pumps 2 and 3 and the control valve 10 are mechanically connected with each other by a bar spring 11. The chambers of the diaphragm pumps 2 and 3 are subdivided by respective diaphragms 4 and 5 into respective driving chambers 6 and 7 and pumping chambers 8 and 9. The medium to be moved, in the present example, the cooling fluid, is pumped through pumping chambers 8 and 9.

Figure 2:
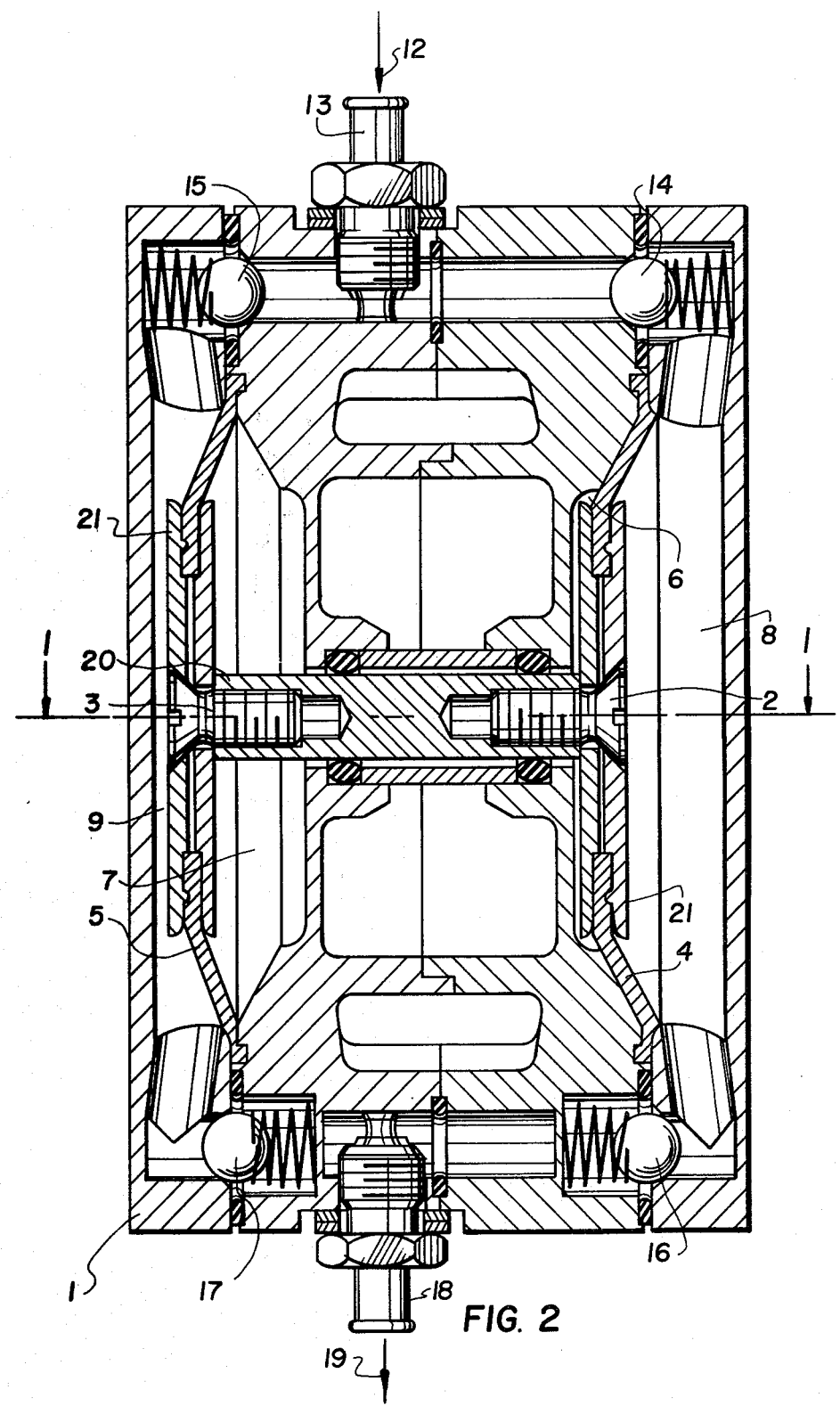
FIG. 2 is a section taken along the line 2—2 of FIG. 1.

As shown in FIG. 2, the cooling medium enters in direction 12 into the casing 1 through connection 13 and flows alternately through respective feed valves 14 and 15 into respective pumping chambers 8 and 9. The cooling medium is then forced out by the movements of the respective diaphragms 4 and 5 through discharge valves 16 and 17 through a discharge connection 18 in the direction of the arrow 19.

The drive of the diaphragms 4 and 5 which are connected with each other by a rigid coupling 20, is effected by the cooling medium vapor which is under pressure corresponding to the temperature. The cooling medium vapor, controlled by the control valve 10, shown in FIG. 1, is fed alternately into respective driving chambers 6 and 7, and forces the respective diaphragm 4 or 5 out of a first end position indicated at 21 for diaphragm 5 into a second end position indicated in dotted lines for diaphragm 4 at 22, thus limiting the path of movement of the coupled diaphragms 4 and 5.

Control valve 10 comprises a cylindrical piston valve 23 which moves axially displaceably in the cylindrical bore 24 of casing 1. The piston valve 23 is locked in the respective end positions by means of respective ball locks 25 and 26, which fall into respective receiving grooves 25' and 26' when the movement of the valve 23 causes them to be positioned in respective alignment therewith. The cooling medium vapor, which is under pressure, is used as a pressure gas and is introduced through a driving gas inlet or connection 27 into axial bore 28 of piston valve 23 and is conducted into the respective driving chamber 6 or 7, depending on the position of the valve 23.

According to FIG. 1, the pressure gas flows from bore 28 over a cross-bore 29 in valve 23 and a bore 30 in a housing part 52, into driving chamber 6. In the first end position 21 of the diaphragms 4 and 5, the other driving chamber 7 is connected for ventilation to the atmosphere through a bore 31 in the housing part 52 and groove 32 on the piston valve 23 and out through an opening 33 in the casing.

Bar spring 11 connects the rigid coupling 20 with piston valve 23. It engages with its one end into a lateral opening or notch 34 of coupling 20, and with the other end, into an opening or notch 35 of the piston valve 23. As a fulcrum, bar spring 11 is movably mounted in opening 36 in fin 37 of the housing part 52 of the casing 1.

Each alternate filling of driving chambers 6 and 7 results in the pumping operation in pumping chambers 8 and 9. The desired snap switching, with which complete filling of pumping chambers 8 and 9 is achieved with each working stroke, is ensured by the bar spring 11. Bar spring 11 is tensioned with each movement of coupling 20. The spring moment is so designed that it just exceeds the counter-force from ball locks or biasing detents 25 or 26, and the friction of the piston valve 23 in cylindrical bore 24, and thus moves piston valve 23 into the opposite end position. Thus, the next working stroke starts.

The detents 25 and 26 are mounted on respective ends of an adjustable plate spring 54 which is biased downwardly at its center by a coil spring 56 whose biasing force may be adjusted by an adjustment screw knob 58, which holds the spring downwardly with adjustable pressure.

While a specific embodiment of the invention has been shown and described in detail to illustrate the application of the principles of the invention, it will be understood that the invention may be embodied otherwise without departing from such principles.

What is claimed is:

1. A pressure gas operated pump, comprising, a housing having first and second spaced apart double pump chambers, first and second spaced apart opposed flexible diaphragms connected to said housing and extending across the respective ones of said first and second double pump chambers and subdividing said double pump chambers into respective first and second driving fluid and pump fluid chambers on respective sides of each of said first and second diaphragms, first and second pump fluid valve inlet and outlet connection means connected to respective first and second pump fluid chambers, a rigid coupling interconnecting said first and second diaphragms, a control valve chamber defined in said housing having a driving fluid inlet, first and second driving fluid inlet and outlet passages defined in said housing connecting respective first and second driving fluid chambers with said control valve chamber, a cylindrical control valve axially slidable in said chamber between respective end positions and defining a passage bore therethrough for driving fluid and having respective first and second radial passages which are selectively alignable in respective end positions of said control valve with said drive fluid inlets to respective first and second driving fluid chambers, detent biasing means holding said control valve in each end position, said housing having a support fin between said control valve and said fixed coupling defining a fulcrum, and a bar spring engaged with said valve, supported on said fulcrum and engaged with said coupling, whereby, said bar spring is pivoted on said fulcrum by movement of said diaphragm to shift said control valve.

2. A pressure gas operated pump, as claimed in claim 1, wherein said bar spring has a round cross-section.

3. A pressure gas operated pump, as claimed in claim 1, wherein said bar spring has a flat cross-section.

4. A pressure gas operated pump, as claimed in claim 1, wherein said fixed coupling has an outer wall with a notch therein, said support fin comprising a wall having a bore therethrough with an offset shoulder portion forming said fulcrum, said bar spring passing through the opening between said coupling and said valve member, said valve member having an exterior wall with a notch therein into which said bar spring is engaged.

* * * * *